United States Patent [19]

Hernandez et al.

[11] Patent Number: 5,065,281
[45] Date of Patent: Nov. 12, 1991

[54] MOLDED INTEGRATED CIRCUIT PACKAGE INCORPORATING HEAT SINK

[75] Inventors: Jorge M. Hernandez, Mesa, Ariz.; Scott Simpson, Woodstock, Conn.

[73] Assignee: Rogers Corporation, Rogers, Conn.

[21] Appl. No.: 479,073

[22] Filed: Feb. 12, 1990

[51] Int. Cl.⁵ ............................................. H05K 7/20
[52] U.S. Cl. .................................. 361/388; 361/387; 361/405; 361/421; 174/52.2
[58] Field of Search ............... 361/383, 386, 387, 388, 361/400, 403, 405, 421; 174/16.3, 52.4, 52.2; 165/80.3, 185; 357/70, 81

[56] References Cited

U.S. PATENT DOCUMENTS

| 3,686,533 | 8/1972 | Garnier | 361/386 |
| 3,836,825 | 9/1974 | Hall | 361/386 |
| 3,930,114 | 12/1975 | Hodge | 174/52.4 |
| 3,984,166 | 10/1976 | Hutchinson | 174/16.3 |
| 4,132,856 | 1/1979 | Hutchinson | 174/52.2 |
| 4,524,238 | 6/1985 | Butt | 174/52.2 |
| 4,855,868 | 8/1989 | Harding | 361/386 |
| 4,868,349 | 9/1989 | Chia | 174/52.4 |
| 4,885,126 | 12/1989 | Polonio | 361/399 |

Primary Examiner—Gerald P. Tolin
Attorney, Agent, or Firm—Fishman, Dionne & Cantor

[57] ABSTRACT

A molded integrated circuit package includes an integrated circuit chip, a heat sink device attached directly to the chip or lead frame and a molded package encapsulating the chip. The heat sink preferably comprises a thermally conductive material having a stem which communicates between the IC chip and the exterior of the molded package for direct conduction of heat from the IC chip to the exterior of the package.

16 Claims, 3 Drawing Sheets

MOLDED INTEGRATED CIRCUIT PACKAGE INCORPORATING HEAT SINK

BACKGROUND OF THE INVENTION

This invention relates to the field of integrated circuits packaged in a molded housing. More particularly, this invention relates to a method of improving heat transfer from the integrated circuit chip in molded integrated circuit packages such as surface mounted leaded or leadless chip carriers, dual-in-line packages, and quad flat packages.

This application is related to U.S. Application Ser. No. 07/479,071 entitled Molded Integrated Circuit Package Incorporating Decoupling Capacitor invented by Jorge Hernandez filed contemporaneously with this application.

Molded integrated circuit packages are well known and are available in several commercial configurations including surface mounted leaded or leadless chip carriers, dual-in-line packages and quad flat packages. All of these packages utilize a lead frame which is connected (e.g., wire bonded) to an IC chip; the frame and chip then being encapsulated in a suitable molding material. It will be appreciated that a known problem associated with molded IC packages is the build-up of heat within the package which is generated by the IC chip. Presently, heat is conducted from the IC chip outside the package primarily through the molding material and only partially through the lead frame. However, in certain applications (i.e. very dense, high power IC's), the relatively poor thermal conductivity of the molding compound renders it insufficient for the heat transfer necessary to maintain the correct operation of the IC chip. Because it is difficult for this heat to transfer out of the molded package problems can result in the function and operation of the integrated circuit thereby leading to costly malfunctioning of the electronic device associated with the molded IC package, or making it impossible to encapsulate very dense high power IC's in molded packages. The only viable alternative is to encapsulate them in an expensive ceramic PGA (pin grid array) package. Clearly, it is very desirable to encapsulate high performance, very dense and high power IC's in molded packages which are less costly than their PGA counterparts.

SUMMARY OF THE INVENTION

The above-discussed and other problems and deficiencies of the prior art are overcome or alleviated by the heat transfer scheme of the present invention which is particularly well suited for use with molded integrated circuit packages incorporating lead frames. In accordance with the present invention, a heat sink device is attached directly to the IC chip or lead frame and thereafter encapsulated within the molded package along with the IC chip resulting in an improvement in heat transfer from the IC chip out of the molded package. The heat sink device preferably comprises a thermally conductive material (such as copper or aluminum) having a stem which communicates between the IC chip and the exterior of the molded package for direct conduction of heat from the IC chip to the exterior of the package.

The above discussed and other features and advantages of the present invention will be appreciated and understood by those of ordinary skill in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
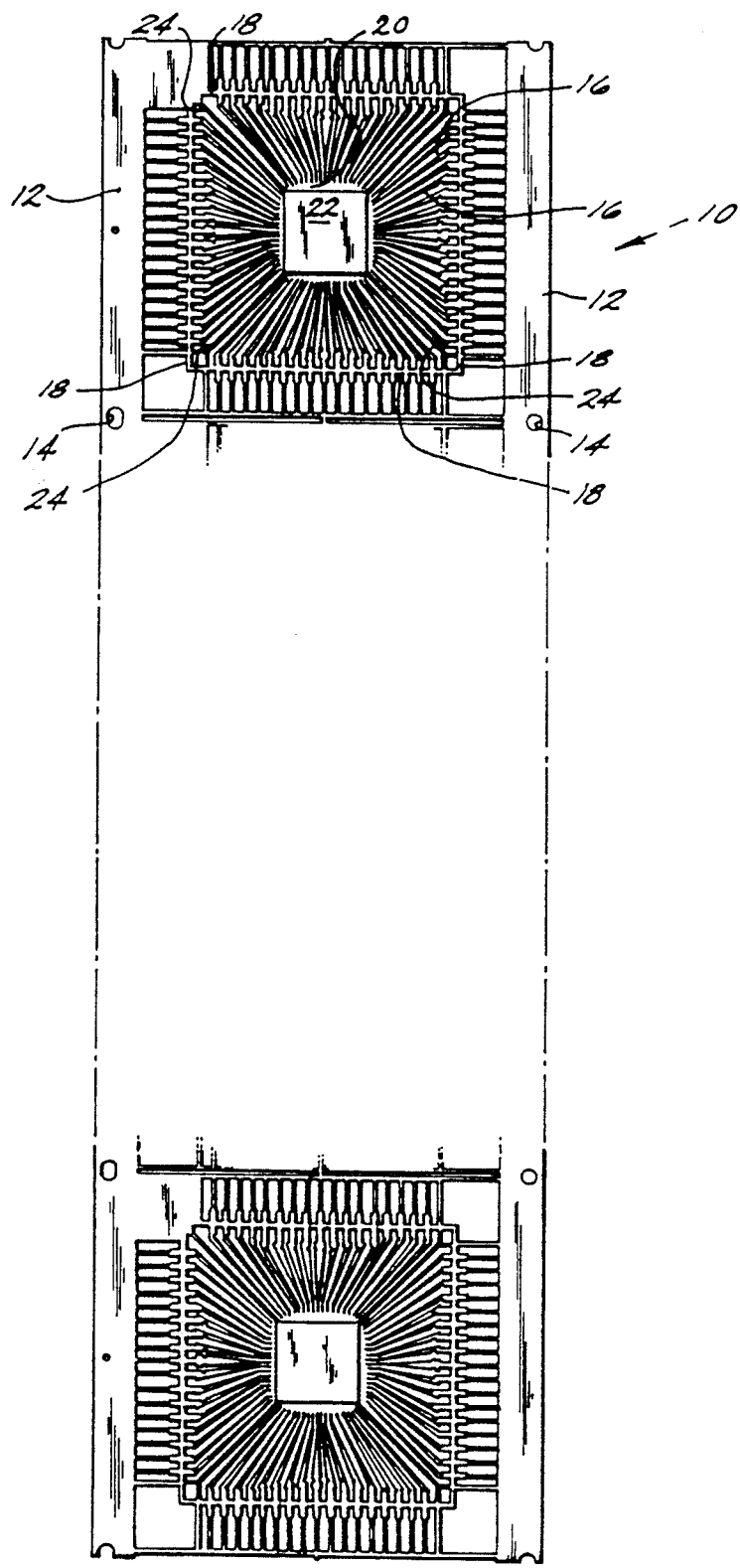
FIG. 1 is a plan view of a known lead frame in accordance with the prior art.

Turning first to FIG. 1, a lead frame strip is shown generally at 10. Such lead frame strips are well known in the art and comprise a plurality of adjacent lead frames interconnected between a pair of carrier supports 12 which incorporate registration holes 14. Each lead frame is made from thin stamped metal and includes a plurality of leads or fingers 16 which are supported on one end by a dam bar 18 and are unsupported on their opposite ends. All of the fingers 16 terminate at a space 20 which has a generally square shape. Within space 20 is a die support platform 22 which is supported on its four corners by four die bars 24 which in turn are connected to dam bars 18.

As is well known in the art, during production of IC packages, an integrated circuit chip or die is positioned on the die support platform 22. Next, the IC chip is electrically connected to each individual finger 16 by use of die wire bonding in a well known fashion. Thereafter, the IC chip and lead frame is encapsulated in a molded package with the ends of the fingers 16 adjacent the dam bar 18 being excised prior to the dam bar and the leads bent so as to form, for example, J-leads and thereby provide a discrete integrated circuit chip package such as the plastic leaded chip carrier (PLCC) shown in FIG. 2. It will be appreciated that no electrical circuitry (wire bonding) is connected between the integrated circuit chip and the die bars 24 so that the die bars are electrically inactive.

Figure 2:
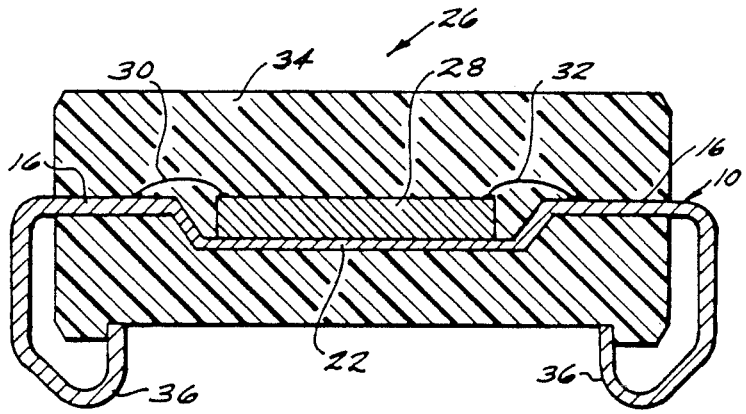
FIG. 2 is a cross sectional elevation view of a molded integrated circuit package in accordance with the prior art.
Figure 4A:
FIG. 4 is a side elevation view and 4B-C are perspective views of a heat sink used in FIG. 3.
Figure 4B:
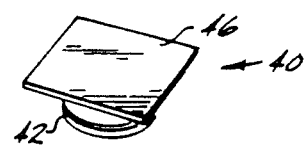
Figure 4C:

Turning now to FIG. 2, a molded integrated circuit chip carrier package in accordance with the prior art is shown generally at 26. Package 26 includes a lead frame 10 wherein the die support platform 22 supports an integrated circuit chip 28 which has been wire bonded via wire bonds 30 and 32 to the fingers 16 of lead frame 10. The lead frame 10 and IC chip 28 has been encapsulated in a molded package 34. The ends of each finger 16 adjacent the dam bar have been excised and the leads bent so as to form J-leads 36. Of course, many other lead configurations may be used.

As mentioned, the molded IC package of FIG. 2 is associated with problems related to retention of heat generated by the IC chip. This heat build-up can deleteriously effect the operation of the IC giving rise to costly and troublesome failures or malfunctioning of electronic equipment. Presently, the path for heat transfer away from the IC chip is primarily through the molding compound. As a result of the molding compound having an inherently low thermal conductivity, the molding compound is a relatively poor thermal conductor. This limits molded packages to relatively low density IC's, which generate relatively low power in the form of heat.

Figure 3:
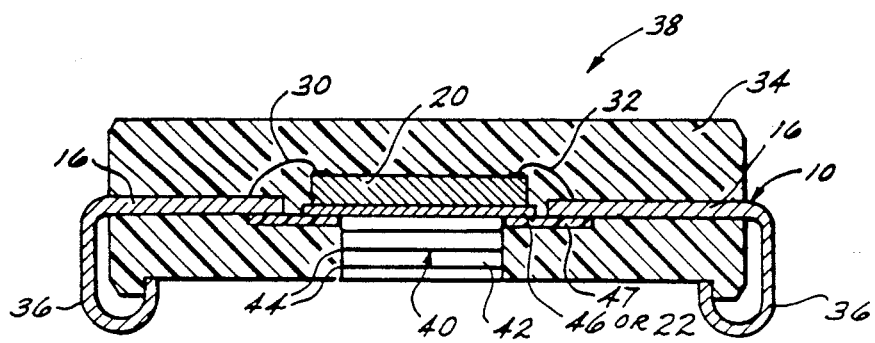
FIG. 3 is a cross sectional elevation view of a molded integrated circuit package in accordance with the present invention having improved thermal conductivity.

Referring now to FIGS. 3 and 4A-C, an embodiment of the present invention is depicted generally at 38 wherein heat dissipation away from the integrated circuit die is improved by the addition of a novel heat sink plug. This plug is shown generally at 40 and includes a generally cylindrical stem 42 preferably having grooving or striations 44 along its outer surface and a planar flat top 46 affixed to one side of cylindrical stem 42. Referring to FIG. 3, when using the heat sink 40 of this invention, the die support platform (item 22 in lead frame 10 of FIG. 1) is initially removed from the lead frame and replaced with the flat top 46 of heat sink 40. The lead frame and the heat sink are bonded together by means of a ring of polyimide film 47 (or another suitable insulating material) with adhesive on the lead frame-heat sink interface. Integrated circuit chip 28 is then adhesively attached to flat surface 46 using a thermally conductive adhesive (i.e., silver filled epoxy, glass or polyimide). Alternatively, the stem 42 may be used without top 46 and directly attached to the die support platform 22. In either case, it will be appreciated that the resulting structure will be the same.

Figure 5A:
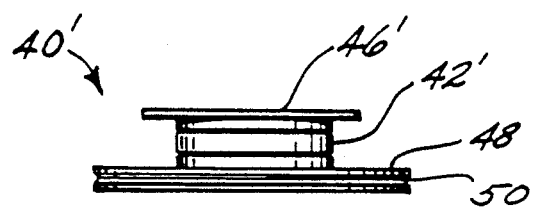
FIG. 5A is a side elevation view and FIG. 5B is a perspective view of an alternative embodiment of a heat sink for use in the present invention.
Figure 5B:
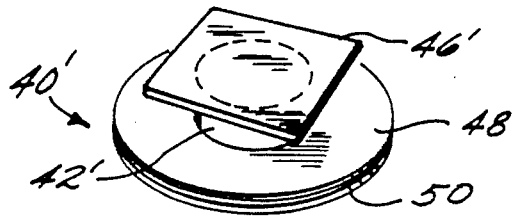
Figure 6:
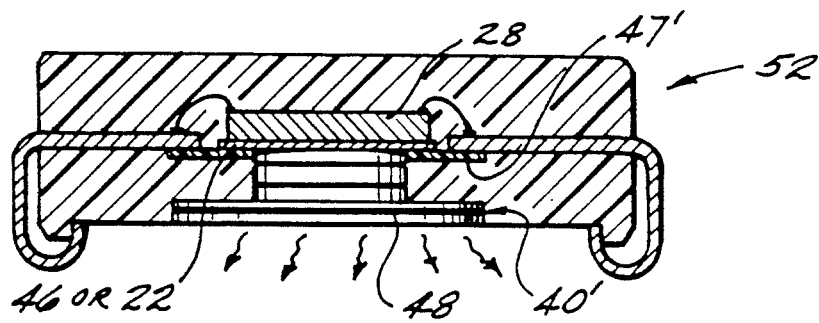
FIG. 6 is a cross sectional elevation view of the present invention incorporating the heat sink of FIG. 5A.
Figure 7:
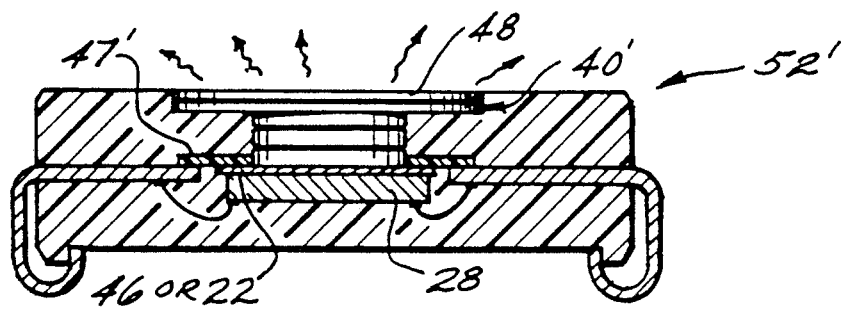
FIG. 7 is a cross sectional elevation view of an embodiment of the present invention incorporating the heat sink of FIG. 5A having an opposed orientation relative to FIG. 6.

In a preferred embodiment of the present invention shown in FIGS. 5A and 5B, the lower portion of stem 42' in a modified heat sink 40' includes a large flattened disk 48 (having a larger surface area than the surface area of top 46 or die support platform 22) which is preferably provided with striations 50 therein. Referring to FIG. 6, preferred heat sink 40' is positioned within package 52 so that large flattened disk 48 is exposed along the bottom of the package so as to maximize heat transfer away from IC chip 28. Similarly in FIG. 7, the components have an opposed orientation such that heat sink 40' is directed upwardly and large disk 48 removes and dissipates heat out of the top of package 52'. Clearly, this is the preferred configuration for the lead frame/heat sink/molded package configuration.

Heat sink 40 and 40' is preferably comprised of a conductive metal such as copper or aluminum. The several striations 44 and 50 are provided to improve the mechanical interlocking with the surrounding molding compound. While heat sink 40, 40' has been shown with stem 42 being cylindrical, it will be appreciated that stem 42 may take on any other configuration. Similarly, disc 48 and top plate 40 may also have any suitable configuration or shape. Preferably, both heat sink configurations 40, 40' terminate exterior of the molding material and are flush with the outside surface of the package.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A molded integrated circuit (IC) package comprising:
   lead frame means, said lead frame means including a plurality of conductive fingers arranged in a preselected pattern, said fingers each having a first end and a second end, said first ends of said fingers terminating at an inner space;
   an integrated circuit support platform being positioned within said space in close proximity to said first ends of said fingers, said support platform having opposed first and second surfaces;
   an integrated circuit chip on said first surface of said support platform, said integrated circuit chip being electrically connected to said first ends of said fingers;
   heat sink plug means attached to said second surface of said support platform and thermally communicating with said integrated circuit chip for transferring heat away from said circuit chip;
   a layer of electrically insulating material bonding said heat sink plug means to said conductive fingers of said lead frame means; and
   molding material encapsulating said integrated circuit chip and heat sink plug means and at least part of said lead frame means.

2. The IC package of claim 1 wherein said heat sink plug means is attached to said second surface of said support platform using an adhesive.

3. The IC package of claim 2 wherein:
   said adhesive is thermally conductive.

4. The IC package of claim 2 wherein:
   said adhesive is electrically non-conductive.

5. The IC package of claim 1 wherein said heat sink plug means comprises a stem attached to said support platform.

6. The IC package of claim 5 wherein:
   said stem terminates at a terminal surface which is exterior of said molding material.

7. The IC package of claim 5 wherein:
   said stem has striations therein for improving mechanical interlocking between said stem and said molding material.

8. The IC package of claim 5 including:
   a flat plate attached to an end of said stem, said flat plate terminating at a terminal surface which is exterior of said molding material.

9. The IC package of claim 8 wherein:
   said flat plate has a surface area which is greater than the surface area of said support platform.

10. The IC package of claim 5 wherein:
    said stem has a cylindrical shape.

11. The IC package of claim 8 wherein:
    said flat plate has a circular shape.

12. The IC package of claim 1 wherein:
    said heat sink plug means is comprised of a metal.

13. The IC package of claim 6 wherein:
    said terminal surface is flush with said molding material.

14. The IC package of claim 8 wherein:
    said terminal surface is flush with said molding material.

15. The IC package of claim 8 including:
    striations along side edges of said flat plate for improving mechanical interlocking between said plate and said molding material.

16. The IC package of claim 1 wherein said insulating material comprises:
    a ring of layer of plastic film coated with an adhesive.

* * * * *